US006818527B2

(12) United States Patent
Murakami

(10) Patent No.: US 6,818,527 B2
(45) Date of Patent: Nov. 16, 2004

(54) METHOD OF MANUFACTURING SEMICONDUCTOR DEVICE WITH SHALLOW TRENCH ISOLATION

(75) Inventor: Hideki Murakami, Miyagi (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/303,874

(22) Filed: Nov. 26, 2002

(65) Prior Publication Data

US 2003/0224579 A1 Dec. 4, 2003

(30) Foreign Application Priority Data

Jun. 3, 2002 (JP) ........................................ 2002/161352

(51) Int. Cl.⁷ ............................................. H01L 21/762
(52) U.S. Cl. ..................................... 438/424; 438/427
(58) Field of Search ..................... 438/692, FOR 111, 438/424–438, FOR 227

(56) References Cited

U.S. PATENT DOCUMENTS

| | | | |
|---|---|---|---|
| 5,721,173 A | | 2/1998 | Yano et al. |
| 6,057,210 A | * | 5/2000 | Yang et al. ............... 438/427 |
| 6,171,929 B1 | * | 1/2001 | Yang et al. ............... 438/427 |
| 6,218,266 B1 | | 4/2001 | Sato et al. |
| 6,541,349 B2 | * | 4/2003 | Arthanari et al. ........... 438/424 |
| 2002/0094649 A1 | * | 7/2002 | Arthanari et al. ........... 438/296 |
| 2002/0137307 A1 | * | 9/2002 | Kim et al. .................. 438/432 |

FOREIGN PATENT DOCUMENTS

| | | |
|---|---|---|
| JP | 06-61204 | 3/1994 |
| JP | 10-261705 | 9/1998 |
| JP | 11-214496 | 8/1999 |
| JP | 11-312730 | 11/1999 |
| JP | 2000-156402 | 6/2000 |

OTHER PUBLICATIONS

Japanese Office Action with translation, Patent Application 2002–161352, Oct. 23, 2003.
Japanese Office Action with translation, Ref No MA001387, Jul. 22, 2003, Re Appn. No. 2002/161352.

* cited by examiner

Primary Examiner—George Fourson
(74) Attorney, Agent, or Firm—Rabin & Berdo, P.C.

(57) ABSTRACT

In a method of manufacturing a semiconductor device, a semiconductor substrate having device regions and an isolation region for separating the device region is provided. Then, a trench is formed in the isolation region of the semiconductor substrate. A nitride film is formed on the device regions of the semiconductor substrate. Next, an oxide film is formed within the trench and on the nitride film so that an upper surface of the oxide film within the trench is located more than about 500 Å below an upper surface of the nitride film. Finally, the oxide film is polished by CMP method so that a height of the upper surface of the oxide film within the trench portion is maintained at less than a height of the upper surface of the nitride film adjacent thereto.

19 Claims, 2 Drawing Sheets

METHOD OF MANUFACTURING SEMICONDUCTOR DEVICE WITH SHALLOW TRENCH ISOLATION

BACKGROUND OF THE INVENTION

The present invention relates to a method of manufacturing a semiconductor device, and particularly to a planarization of a semiconductor device structure with a shallow trench isolation (Hereinafter STI).

STI has been used as one device isolation technology for isolating device regions from one another. The STI is aimed at defining trenches in a semiconductor substrate and embedding an insulating material therein to thereby form device isolation layers. After the formation of the device isolation layers by the STI, the resultant product is planarized by CMP (Chemical-Mechanical Polishing) or the like. Such planarization is required to accurately fix up the position of other conductor layers where other conductor layers are further formed on each device isolation layer by photolithography.

A conventional method for carrying out the above processing will be explained below. A silicon nitride film (which will serve as a stopper layer upon CMP) is first formed on a semiconductor substrate, e.g., a silicon substrate. An unillustrated photomask is formed thereon. With the photomask as a mask, the nitride film and the silicon substrate are etched to form trenches (device isolation trenches). Next, a photoresist is removed and a device isolation oxide film is formed within the trenches and on the nitride film. Thereafter, the resultant product is planarized by CMP. Next, the nitride film is removed, thus resulting in the completion of an STI structure.

In the conventional method referred to above, when the trenches are buried with the oxide film, the thickness of the oxide film is set so as to become larger than the sum of the depth of each trench and the thickness of the nitride film. In other words, the upper surface of the oxide film is set so as to be located above the upper surface of the nitride film in a portion of each trench. Thereafter, the oxide film on the nitride film is chipped or cut off by the following CMP, and polishing is stopped when the nitride film is exposed over the whole surface.

The speed of polishing by such CMP as described above depends on each pattern. Namely, a problem arises in that a low-density section (nondense pattern section) of each device region is greater in polishing speed than a high-density section (dense pattern section) of the device region, and the upper surface of the oxide film differs in height in the nondense pattern section and the dense pattern section upon CMP completion.

As countermeasures against such a problem, there has heretofore been adopted a method of inserting a dummy pattern into the low-density section, and effecting photolithography and etching on the high-density section in reverse by use of a device reverse mask to perform a decrease in pattern density or the like, thereby reducing a nondense/dense difference between patterns. However, a wiring rule has recently been further brought into micro form, and there may be cases in which the difference in density between device patterns becomes large according to the property of each formed circuit. The above-described method encounters difficulties in solving the nondense/dense difference. Thus, a problem that the height of the upper surface of the oxide film varies, is becoming increasingly serious.

SUMMARY OF THE INVENTION

The present invention has been made to solve the foregoing problems. It is an object of the present invention to reduce variations in the height of an upper surface of an oxide film in an STI structure, i.e., improve flatness thereof.

In a method of manufacturing a semiconductor device of the present invention, a semiconductor substrate having device regions and an isolation region for separating the device region is provided. Then, a trench is formed in the isolation region of the semiconductor substrate. A nitride film is formed on the device regions of the semiconductor substrate. Next, an oxide film is formed within the trench and on the nitride film so that an upper surface of the oxide film within the trench is located more than about 500 Å below an upper surface of the nitride film. Finally, the oxide film is polished by CMP method so that a height of the upper surface of the oxide film within the trench portion is maintained at less than a height of the upper surface of the nitride film adjacent thereto.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1A:
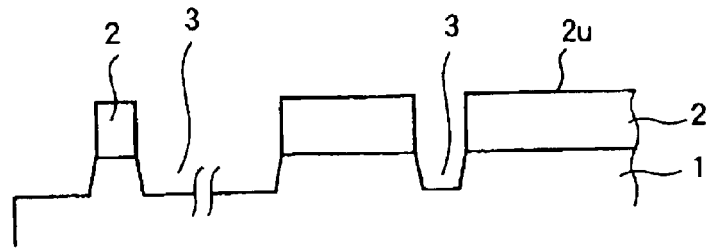
FIGS. 1(a) through 1(e) are respectively cross-sectional views showing states of a semiconductor device in process steps of a method of manufacturing the semiconductor device, according to an embodiment of the present invention.

A method of manufacturing a semiconductor device, according to an embodiment of the present invention will hereinafter be described with reference to FIG. 1. A silicon nitride film 2 (which will serve as a stopper layer upon CMP) is first formed on a semiconductor substrate, e.g., a silicon substrate 1. Next, an unillustrated photomask is formed on the nitride film 2. With the photomask as a mask, the nitride film 2 and the silicon substrate 1 are etched to form trenches (device isolation trenches) 3 (see FIG. 1(a)). Next, a photoresist is removed and a device isolation oxide film 4 is formed within the trenches 3 and on the nitride film 2 (see FIG. 1(b)). Thereafter, the resultant product is planarized by chemical mechanical polishing (CMP) (see FIGS. 1(c) and 1(d)). Next, the nitride film 2 is removed (see FIG. 1(e)). Thus, an STI structure is completed.

In the present invention, the sum of the depth of each trench 3 and the thickness of the nitride film 2 is sufficiently larger than the thickness of the above oxide film 4 after the formation of the oxide film 4 and before the above CMP. In other words, the thicknesses of the oxide film 4 and the nitride film 2, and the depth of each trench are determined or established in such a manner that an upper surface 2u of the nitride film 2 is located sufficiently above an upper surface 4u of the oxide film 4 in a portion of the trench 3. Thus, the height of the upper surface 4u of the oxide film 4 in the trench portion is maintained at less than the height of the upper surface 2u of the nitride film 2 adjacent thereto until the CMP is finished. As a result, mechanical polishing is not effected on only the oxide film 4 in the portion of each trench 3 upon the CMP (i.e., when the adjacent nitride films 2 are not subjected to the mechanical polishing, the oxide film 4 in each trench portion is not mechanically polished). Therefore, the degree of flatness of the oxide film 4, which is yielded as a result of the planarization, is not affected by patterns in device regions.

Figure 1B:
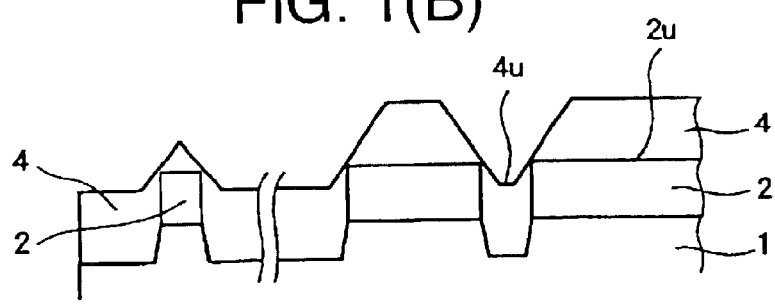
Figure 1C:
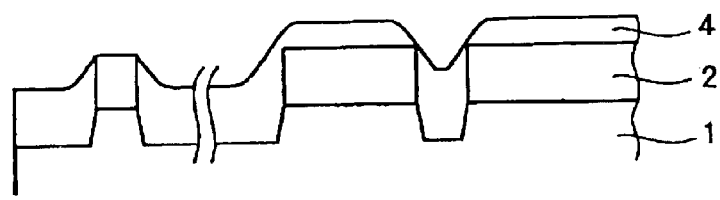
Figure 1D:
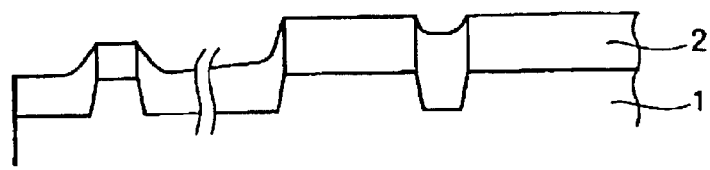
Figure 1E:
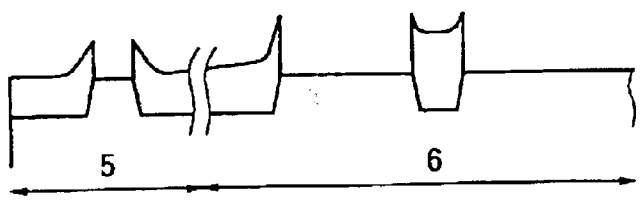

A nondense pattern section 5 and a dense pattern section 6 differ in polishing speed from each other upon CMP (see FIGS. 1(c) and 1(d)). The chipping-off (decrease in thickness) of the oxide film 4 in the nondense pattern section 5 proceeds ahead of that in the dense pattern section 6. However, since the upper surface 4u of the oxide film 4 in the portion of each trench 3 is lower than the upper surface 2u of the nitride film 2 after the removal of all the oxide films 4 on the nitride film 2 in the device regions, the nitride film 2 is subjected to mechanical polishing as well as the oxide film 4 and the speed of its chipping-off becomes relatively low. While the oxide film 4 in each trench 3 is subjected not only to the mechanical polishing but also to chemical polishing, the speed of its chipping-off by the chemical polishing is relatively low. On the whole, a selection ratio between the oxide film 4 and the nitride film 2 at CMP ranges from 4:1 to 200:1. Therefore, the chipping-off of the oxide film 4 in the trench portion does not proceed so much in the nondense pattern section 5, and hence the chipping-off of the oxide film 4 in the dense pattern section 6 is faster than that in the nondense pattern section 5. When all the oxide films 4 on the nitride film 2 are removed and the nitride film 2 is exposed over the whole surface, the CMP is stopped at that time even in the dense pattern section 6.

Since the chipping-off proceeds slowly at the nondense pattern section 5, particularly, the trench portion while the chipping-off in the dense pattern section 6 is proceeding, the thickness of the oxide films 4 in the trench portions can be rendered substantially identical even in both the nondense pattern section 5 and the dense pattern section 6 upon the CMP stop. As a result, the oxide film 4 in the portion of each trench 3, i.e., an STI height becomes uniform without depending on each pattern even after the removal of the nitride film 2 (see FIG. 1(e)).

As one example, the thicknesses of the nitride film 2 and oxide film 4, and the depth of each trench 3 are defined in such a manner that when the oxide film 4 is formed (see FIG. 1(b)), the upper surface 2u of the nitride film 2 is located about 1800 Å (Angstroms) above the upper surface 4u of the oxide film 4 in each trench 3.

The depth of the trench 3 ranges from about 2000 to 4000 Å, for example. Changes in the thicknesses of the oxide film 4 and the nitride film 2 and the thicknesses thereof in the nondense pattern section 5 where the depth of the trench is about 4000 Å, will be explained below as one example.

Figure 2A:
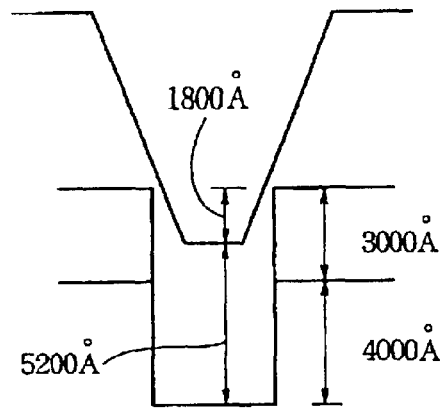
FIGS. 2(a) through 2(d) are diagrams showing one example illustrative of changes in thickness by CMP.

As shown in FIG. 2(a), the thickness of the nitride film 2 is about 3000 Å, for example, and the thickness of the oxide film 4 is about 5200 Å, for example. In this case, the sum of the thickness of the nitride film 2 and the depth of each trench in the substrate is about (4000+3000=7000 Å) and is greater by about 1800 Å than the thickness of the oxide film 4, which is about 5200 Å. Namely, the upper surface 2u of the nitride film 2 is located about 1800 Å above the upper surface 4u of the oxide film 4 in each trench 3.

Figure 2B:
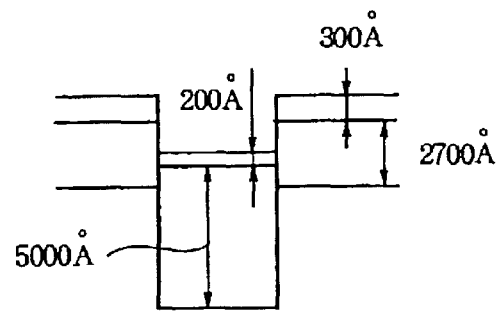

In such a case, the oxide film 4 on the nitride film 2 in the nondense pattern section 5 is all chipped or cut off by the CMP. Thereafter, the nitride film 2 is chipped off about 300 Å in the nondense pattern section 5 while the nitride film 2 is exposed over the whole surface in the dense pattern section 6, thus resulting in about 5000 Å. During this period, the oxide film 4 in each trench 3 is cut off by about 200 Å, thus resulting in about 5000 Å (see FIG. 2(b)). Even in this state, the thickness of the oxide film 4 in the trench portion of the nondense pattern section 5 is greater by about 1000 Å than the depth of the trench.

Figure 2C:
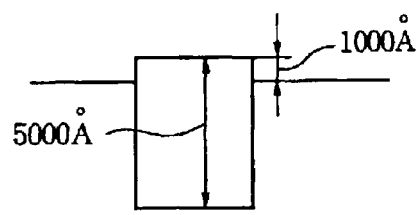

When the nitride film 2 is perfectly exposed in the dense pattern section 6, the CMP is stopped, and the nitride film 2 is thereafter removed (see FIG. 2(c)). In this state, the upper surface 4u of the oxide film 4 in the trench portion is placed about 1000 Å above the upper surface 1u of the silicon substrate 1.

Figure 2D:
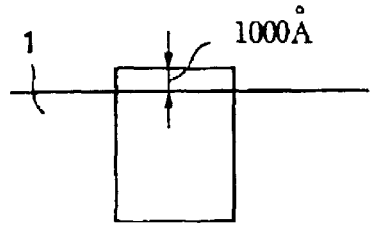

According to the known process steps executed subsequently to the above, e.g., the formation of a sacrifice oxide film on an exposed semiconductor substrate and its removal or the like, the oxide film 4 in each trench portion is chipped off about 1000 Å. Consequently, the oxide film results in the same height as the surface of the silicon substrate 1 (see FIG. 2(d)). Incidentally, it is desirable that the upper surface of the oxide film 4 in the trench portion is not set lower than the upper surface of the silicon substrate 1.

In the aforementioned embodiment, the thicknesses of the nitride film 2 and the oxide film 4, and the depth of each trench 3 are defined in such a manner that the upper surface 2u of the nitride film 2 is located about 1800 Å above the upper surface 4u of the oxide film 4 in each trench 3 in a state subsequent to the formation of the oxide film 4 and prior to the execution of the CMP. However, the above "difference in height" is not limited to about 1800 Å, and may be set to such a sufficient value that no mechanical polishing is effected on only the oxide film 4 in the portion of each trench 3 (when the oxide film 4 in the portion of the trench 3 undergoes the mechanical polishing, the oxide film 4 or the nitride film 2 other than the portion of the trench 3 is subjected to the mechanical polishing simultaneously). According to discussions of the present inventors, the difference in height may be about 500 Å or more. When the difference in height becomes lower than it, the oxide film 4 is apt to be chipped off, so that a desired effect cannot be obtained.

The thickness of the oxide film 4 may preferably be set to the sum of the depth of each trench 3, the amount of chipping-off subsequent to CMP (about 1000 Å or so), and the amount of chipping-off by CMP (about 200 Å). Defining the trench 3 deeply encounters difficulties in forming an oxide film inside. When the depth of the trench 3 is set to about 4000 Å as described above, the thickness of the oxide film 4 may preferably be set to about 5200 Å. Thus, it is desirable that the thickness of the nitride film 2 is about (5200+500−4000=1700)Å or more to allow the upper surface 2u of the nitride film 2 to be placed at least about 500 Å or more above the upper surface 4u of the oxide film 4 in each trench 3 in the state subsequent to the formation of the oxide film 4 and prior to the execution of CMP as described above. On the other hand, when the silicon nitride film 2 is excessively made thick, the removal thereof becomes difficult after the execution of CMP. In terms of these, the thickness of the nitride film 2 may preferably be set to about 5000 Å or less.

According to the present invention, the thicknesses of the oxide film and nitride film, and the depth of each trench are defined such that the upper surface of the nitride film is located sufficiently above the upper surface of the oxide film in a trench portion in a state subsequent to the formation of the oxide film and prior to the execution of CMP, whereby the height of the upper surface of the oxide film in the trench portion is maintained at less than the height of the upper surface of the nitride film adjacent thereto until the CMP is finished. It is therefore possible to keep approximately constant the thickness of the oxide film in the trench portion at each of the nondense pattern section and the dense pattern section.

While the present invention has been described with reference to the illustrative embodiment, this description is not intended to be construed in a limiting sense. Various modifications of the illustrative embodiment will be apparent to those skilled in the art on reference to this description. It is therefore contemplated that the appended claims will cover any such modifications or embodiments as fall within the true scope of the invention.

What is claimed is:

1. A method of manufacturing a semiconductor device comprising:

providing a semiconductor substrate having a plurality of device regions and an isolation region for separating the device regions;

forming a trench in the isolation region of the semiconductor substrate;

forming a nitride film on the device regions of the semiconductor substrate;

forming an oxide film within the trench and on the nitride film so that an upper surface of the oxide film within the trench is located more than about 500 Å below an upper surface of the nitride film; and polishing the oxide film by a CMP method so that a height of the upper surface of the oxide film within the trench is maintained at less than a height of the upper surface of the nitride film adjacent thereto, wherein said polishing reduces the height of the upper surface of the oxide film within the trench.

2. The method according to claim 1, wherein the oxide film formed on the nitride film is completely removed by the polishing.

3. The method according to claim 1, wherein a part of the nitride film is removed by the polishing.

4. The method according to claim 1, wherein the depth of the trench ranges from about 2000 Å to about 4000 Å.

5. The method according to claim 1, further comprising removing the nitride film after polishing.

6. A method of manufacturing a semiconductor device comprising:

providing a semiconductor substrate having a plurality of device regions and an isolation region for separating the device regions;

forming a nitride film on an entire surface of the semiconductor substrate;

removing a part of the nitride film and a part of the semiconductor substrate within the isolation region so that a trench is formed in the isolation region of the semiconductor substrate, and the nitride film remains on the device regions of the semiconductor substrate;

forming an oxide film within the trench and on the nitride film so that an upper surface of the oxide film within the trench is located more than about 500 Å below an upper surface of the remaining nitride film; and polishing the oxide film by a CMP method so that a height of the upper surface of the oxide film within the trench is maintained at less than a height of the upper surface of the nitride film adjacent thereto, wherein said polishing reduces the height of the upper surface of the oxide film within the trench.

7. The method according to claim 6, wherein the oxide film formed on the nitride film is completely removed by the polishing.

8. The method according to claim 6, wherein a part of the nitride film is removed by the polishing.

9. The method according to claim 6, wherein the depth of the trench ranges from about 2000 Å to about 4000 Å.

10. The method according to claim 6, further comprising removing the nitride film after polishing.

11. The method according to claim 6, wherein the removing is performed using a photomask as a mask.

12. A method of manufacturing a semiconductor device comprising:

providing a semiconductor substrate having a plurality of device regions and an isolation region for separating the device regions;

forming a trench having a depth D1 in the isolation region of the semiconductor substrate;

forming a nitride film having a thickness T1 on the device regions of the semiconductor substrate;

forming an oxide film having a thickness T2 within the trench and on the nitride film so that an upper surface of the oxide film within the trench is located more than about 500 Å below an upper surface of the nitride film;

polishing a part of the oxide film having a thickness T3 by a CMP method so that a height of the upper surface of the oxide film within the trench is maintained at less than a height of the upper surface of the nitride film adjacent thereto, wherein said polishing reduces the height of the upper surface of the oxide film within the trench; and further removing another part of the oxide film having a thickness of T4.

13. The method according to claim 12, wherein the oxide film formed on the nitride film is completely removed by the polishing.

14. The method according to claim 12, wherein a part of the nitride film is removed by the polishing.

15. The method according to claim 12, wherein the depth D1 of the trench ranges from about 2000 Å to about 4000 Å.

16. The method according to claim 12, further comprising removing the nitride film after polishing.

17. The method according to claim 12, wherein the thickness T2 is calculated as follows:

$$T2=D1+T3+T4.$$

18. The method according to claim 12, wherein the thickness T1 is calculated as follows:

$$T1=T2+500\ \text{Å}-D1.$$

19. The method according to claim 12, wherein the thickness T1 is equal to or less than 5000 A.

* * * * *